(12) United States Patent
Kamin et al.

(10) Patent No.: US 6,709,976 B1
(45) Date of Patent: Mar. 23, 2004

(54) METHOD FOR IMPROVING RELIABILITY IN TRENCH STRUCTURES

(75) Inventors: Nackieb M. Kamin, La Mesa, CA (US); Stephen D. Russell, San Diego, CA (US); Stanley R. Clayton, Spring Valley, CA (US); Shannon D. Kasa, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/207,419

(22) Filed: Jul. 29, 2002

(51) Int. Cl.[7] .......................................... H01L 21/4763
(52) U.S. Cl. ..................... 438/638; 438/700; 438/743
(58) Field of Search ................................ 438/638, 690, 438/691, 700, 723, 743, 756, 269, 424, 429, 430

(56) References Cited

U.S. PATENT DOCUMENTS

| 4,693,781 A | 9/1987 | Leung et al. |
| 4,923,821 A | 5/1990 | Namose |
| 5,882,982 A | 3/1999 | Zheng et al. |
| 5,910,018 A | 6/1999 | Jang |
| 6,008,131 A | 12/1999 | Chen |
| 6,087,709 A | 7/2000 | Gandy et al. |
| 6,107,143 A | 8/2000 | Park et al. |
| 6,133,113 A | 10/2000 | Jenq et al. |
| 6,165,854 A | 12/2000 | Wu |
| 6,180,490 B1 | 1/2001 | Vassiliev et al. |
| 6,501,149 B2 * | 12/2002 | Hong |

* cited by examiner

Primary Examiner—Phuc T. Dang
(74) Attorney, Agent, or Firm—Peter A. Lipovsky; Michael A. Kagan; Allan Y. Lee

(57) ABSTRACT

The invention describes an improved method of fabricating trench structures. This method enhances trench structure reliability by reducing dielectric breakdown in high voltage applications, for example. The invention uses etching and thermal oxidation techniques to round and smooth the corners at the bottom of the trench structure. The smoothing of the trench corners reduces the electrical fields that cause insulator breakdown.

23 Claims, 4 Drawing Sheets

METHOD FOR IMPROVING RELIABILITY IN TRENCH STRUCTURES

BACKGROUND OF THE INVENTION

Trench structures are commonly used for controlling high voltages and high currents among integrated circuit devices. The trench structure is a gap formed in the slide of a semiconductor substrate between devices on the substrate. The structure allows relatively high voltages and currents to be used in dense circuit arrangements.

Some devices, such as the metal-oxide semiconductor-controlled thyristor (MCT), are used for high power applications. This necessitates the forming of arrays of densely packed trenches across an entire wafer. The MCT devices place inversion and accumulation channel regions perpendicular to the surface plane to control current flow normal to the surface. Therefore, trench structures are fabricated vertically (vs. a planar configuration) such that power flows from a wafer's top surface (gate/source) to the wafer's bottom surface (drain).

The sharp corners at the bottom of the trenches are know to be sources of device failure or degradation, as electrical fields concentrate at these corners. Additionally, gate oxide will often become thinned at the corners, increasing the importance of having high quality oxide in the structure.

FIG. 1 schematically shows prior art for power semiconductor devices using a trench structure. Only a single trench is shown, however it is a common practice to have a plurality of trenches formed with other layers, regions and interconnections. Trench structure 10 is formed in a substrate 12, such as semiconductor silicon, by etching the semiconductor in a plasma or reactive ion process for example. Such a process achieves a high degree of anisotropy to thereby form nearly vertical sidewalls and thus decrease the lateral dimensions on the semiconductor wafer.

An insulating layer 14 is then formed on the walls of the trench. Insulating layer 14 is typically silicon dioxide. Such silicon dioxide is commonly formed by growing a thermal oxide on the silicon such as by exposing the silicon to an oxygen environment at elevated tenmperatures. Conductive layer 16 is then formed in the trench, such as through depositions, doping and patterning as commonly practiced in the semiconductor fabrication art.

Conductive layer 16 is typically polycrystalline silicon (polysilicon) containing dopant impurities. The close-up region in FIG. 1 shows a corner 18 at the base of trench 10. The corner formed by the "dry" etching processes of plasma or reactiveion etching is an angular corner approximating a right angle. Forming an insulating layer at such a tight corner is difficult, resulting in a thinning 20 of the insulator in that vicinity. The thinner insulator promotes an increase in electric field and an enhancement of dielectric breakdown at high voltages.

There is thus a need for an improved trench structure that does not suffer from the effects of dielectric breakdown and electric field concentration.

SUMMARY OF THE INVENTION

The invention describes an improved method of fabricating trench structures. Such an improvement enhances trench structure reliability by reducing dielectric breakdown in high voltage applications for example. An important consideration in trench devices is the smoothing of the trench corners to thereby reduce the electrical fields that cause such insulator breakdown The invention is a process for rounding and smoothing the trench bottom through etching and thermal oxidation techniques.

An object of this invention is to provide more efficient trench structures.

Another object of this invention is to provide trench structures that minimize electric field concentration and dielectric breakdown in the structures.

Still another object of this invention is to provide a trench structure having rounded trench corners.

Yet another object of this invention is to provide a process for promoting the above described objects.

Other objects, advantages and new features of the invention will become apparent from the following detailed description considered in conjunction with the accompanied drawings.

DESCRIPTION

Figure 1:
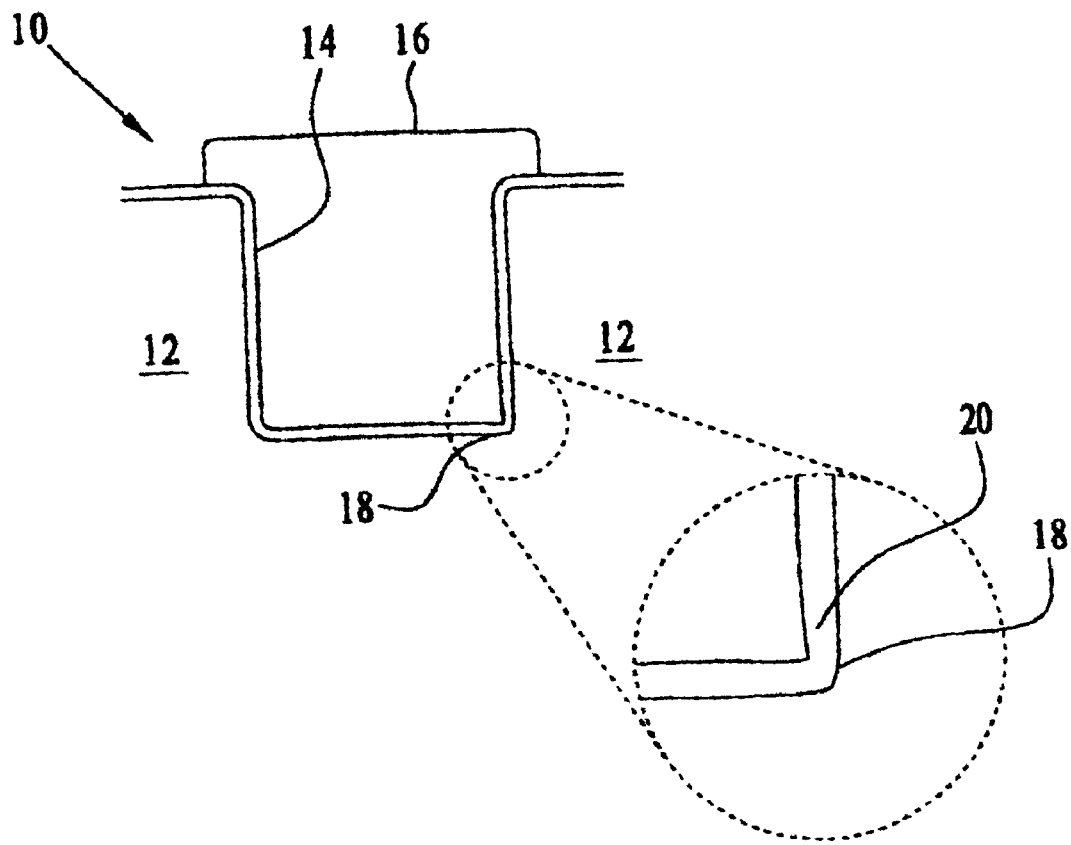
FIG. 1 illustrates a prior art trench structure with a detailed view of this structure also shown.
Figure 2:
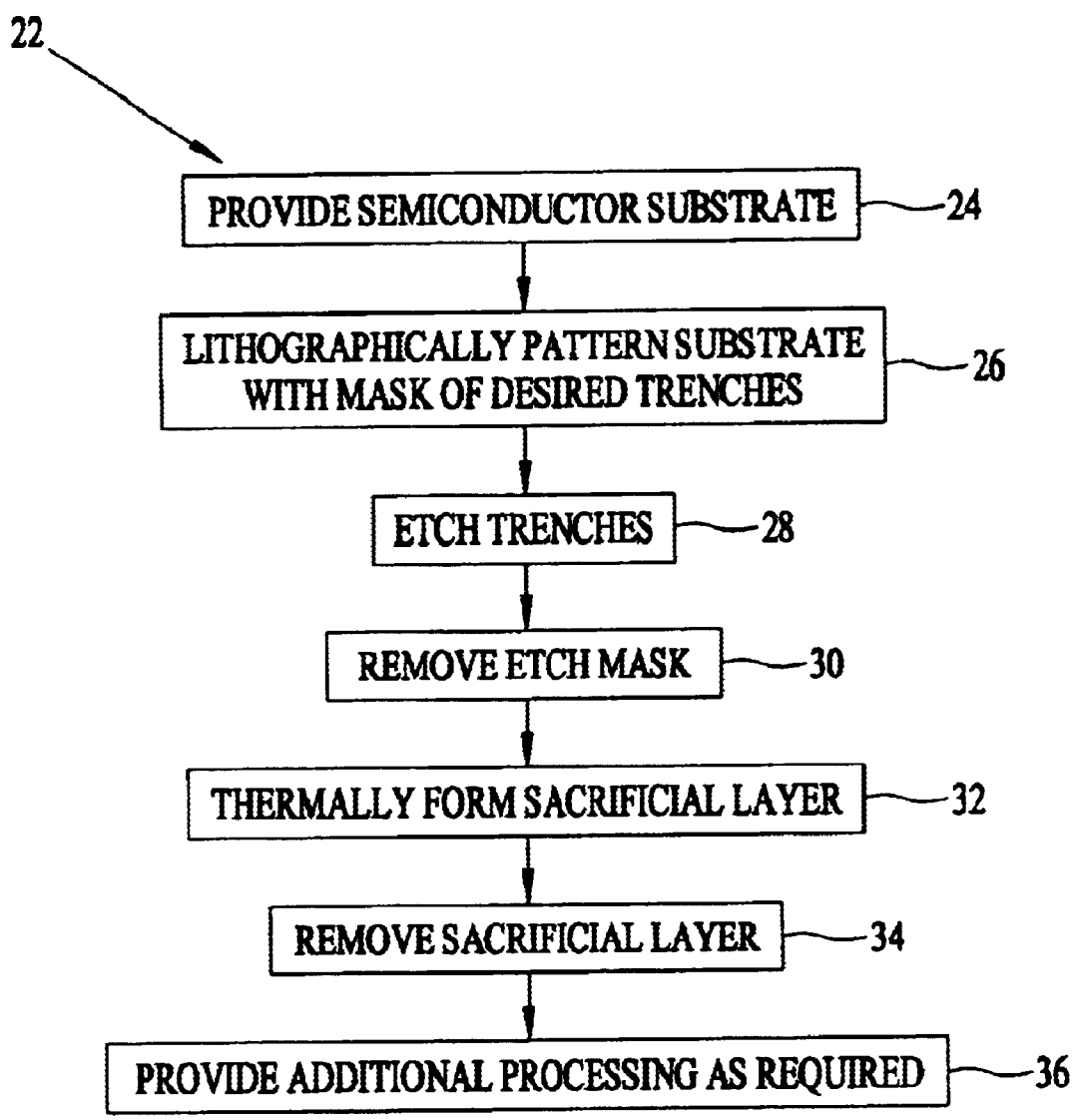
FIG. 2 describes an exemplary process for carrying out an embodiment of the invention.

Referring now to FIG. 2, an exemplary process 22 for improving reliability in trench devices according to an embodiment of the invention is shown. The process begins by providing a substrate 24 such as a semiconductor substrate. The substrate is patterned for the desired trenches 26, such as may be done photo-lithographically with a template or mask. Such patterning is commonly practiced in the art of semiconductor processing using, for example, a photosensitive polymer or photoresist which is then locally exposed to ultraviolet fight and subsequently developed to expose only portions of the semiconductor source for subsequent processing. The substrate is then etched 28, for example, by a ration or plasma process, to form the desired trenches. After removing the photoresist 30, a thermal treatment is performed 32, to form a sacrificial insulating layer that is greater in thickness than about 150 nm.

As will be further described, the thermal treatment, typically an oxidation, cones a portion of the semiconductor substrate by a process in which the ambient gas diffuses into and reacts with the semiconductor. The insulating layer is removed 34, whereupon additional processing 36 may then be performed. Such additional processing may include, for example, forming a new insulator within the trench by a subsequent thermal treatment and forming a conductive layer within the trench on top of the new insulator. Alternately, additional processing may include forming a new insulator within the trench through a combination of thermal treatments and deposition steps (such as plasma-enhanced chemical vapor deposition, and the like), followed by forming a conductive layer within the trench on top of the new insulator.

Figure 3:
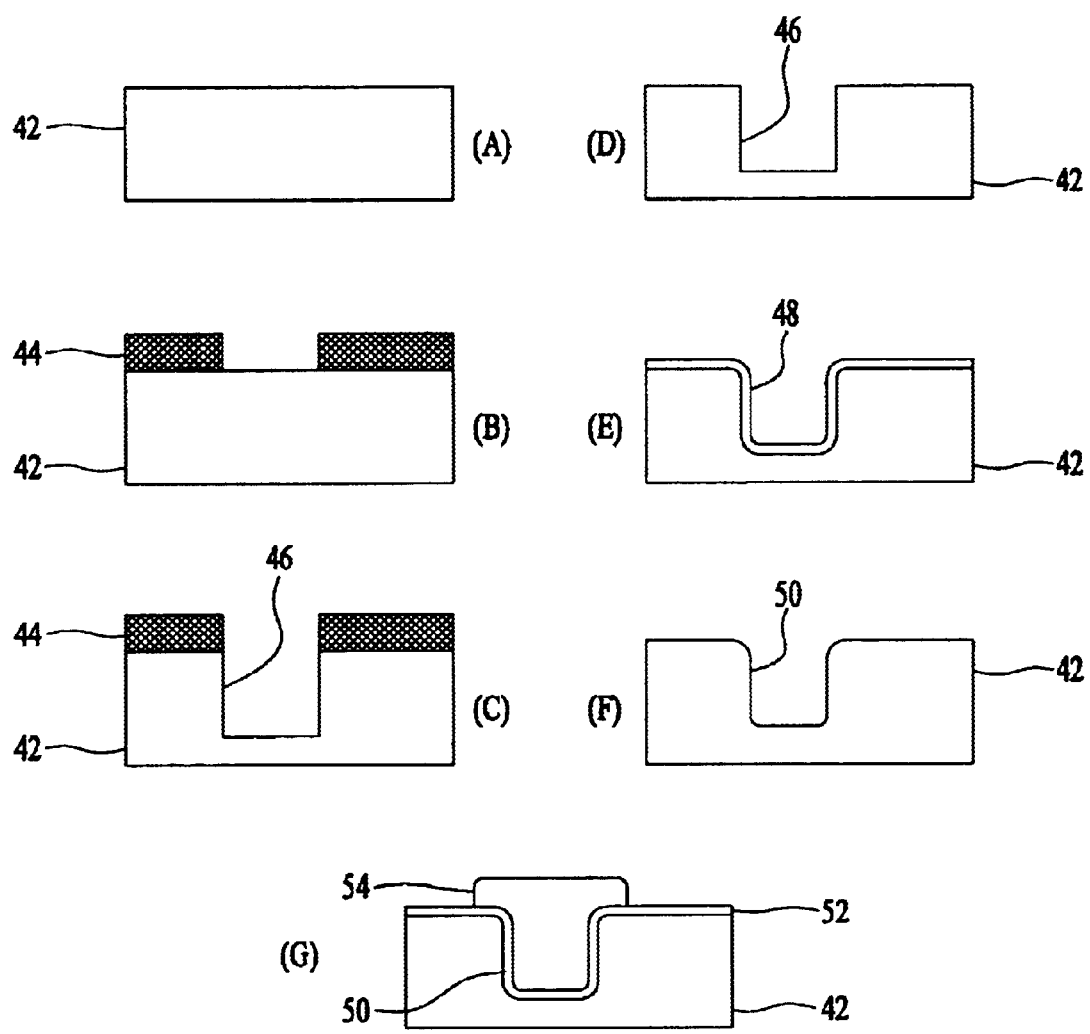
FIGS. 3A–3G show various production stages of an exemplary embodiment of the invention.

FIG. 3 shows a schematic cross-section of a trench device as my be fabricated according to the process described in FIG. 2. In FIG. 3(*a*) a substrate 42 is provided. A mask 44 is formed, such as by lithography, in FIG. 3(*b*). FIG. 3(*c*) shows trench 46 formed in semiconductor substrate 42. FIG.

3(d) shows trench 44 with the mask removed. In FIG. 3(e), there is shown an insulator 48 that is formed in the trench via thermal treatment, for example. Processing details of this are given below. FIG. 3(f) shows the improved trench structure 50 with rounded trench corners. FIG. 3(g) shows a trench structure that has had subsequent processing that includes forming a new insulator 52 in rounded trench 50 and forming a conductive layer 54 in the rounded trench 50 on insulator 52.

A detailed example of this invention is now to be described. Conventional photolithography may be used to spincast and develop a photoresist on a semiconductor substrate. Through the exposed areas of the pattern, trenches are formed in the substrate such as via a plasma etch process. An exemplary etch process uses CF4 at a flow rate of about 35 standard cubic centimeters per minute (sccm) at a radio frequency (RF) power of about 400 watts, HBr and CL2 at flow rates of about 80 sccm and about 10 sccm, respectively, at an RF power of about 300 watts each. The etch is performed at a pressure of about 125 mtorr, magnetic field of about 30 Gauss and an etch duration of about 250 seconds. This exemplary processing produces trenches about 2 microns wide and about 2 microns deep, suitable for most power semiconductor devices such as a MCT.

The photoresist is then removed such as by using oxygen-plasma bombardment or ashing, for example. Following the photoresist removal, a sacrificial oxide of about 250 nm thickness is formed. Formation of the oxide is accomplished, for example, by exposing the silicon substrate and its trenches to oxygen at about 3000 sccm and hydrogen at about 4000 sccm These gases are applied at about 600 torr and at about 950 degrees Celsius for about 65 minutes.

This sacrificial oxide is then stripped, such as using a wet etch process of 10:1 Ammonium Fluoride:Hydrofluoric acid solution (40% NH4F: 49% HF) or similar buffered oxide etch, to form the improved rounded trench structure. A gate oxide is subsequently formed in the trench by a subsequent thermal oxidation, for example one at about 875 degrees Celsius for about 70.5 minutes at atmospheric pressure of oxygen at a flow rate of about 3000 sccm. This thermal oxidation will grow about 15 nm of silicon dioxide on the rounded trench structure.

The gate oxide may be subsequently thickened such as using a lower thermal budget process, including the deposition of a plasma enhanced chemical vapor deposition (PECVD) oxide of about 60 nm thickness. An example of such a PECVD process is the Plasma Enhanced Tetra-Ethyl Ortho Silicate (PETEOS) process. In this process, helium, oxygen, and TEOS may be used at 1000, 1200, and 1000 sccm, respectively. The process may be completed in about 8 seconds at about 415 degrees Celsius and 725 watts power. The combined (thickened) stacked oxide further acts to improve reliability in the trench structure by minimizing the propagation of pinholes that may occur in a single continuous thermal oxide of an equivalent thickness.

Figure 4:
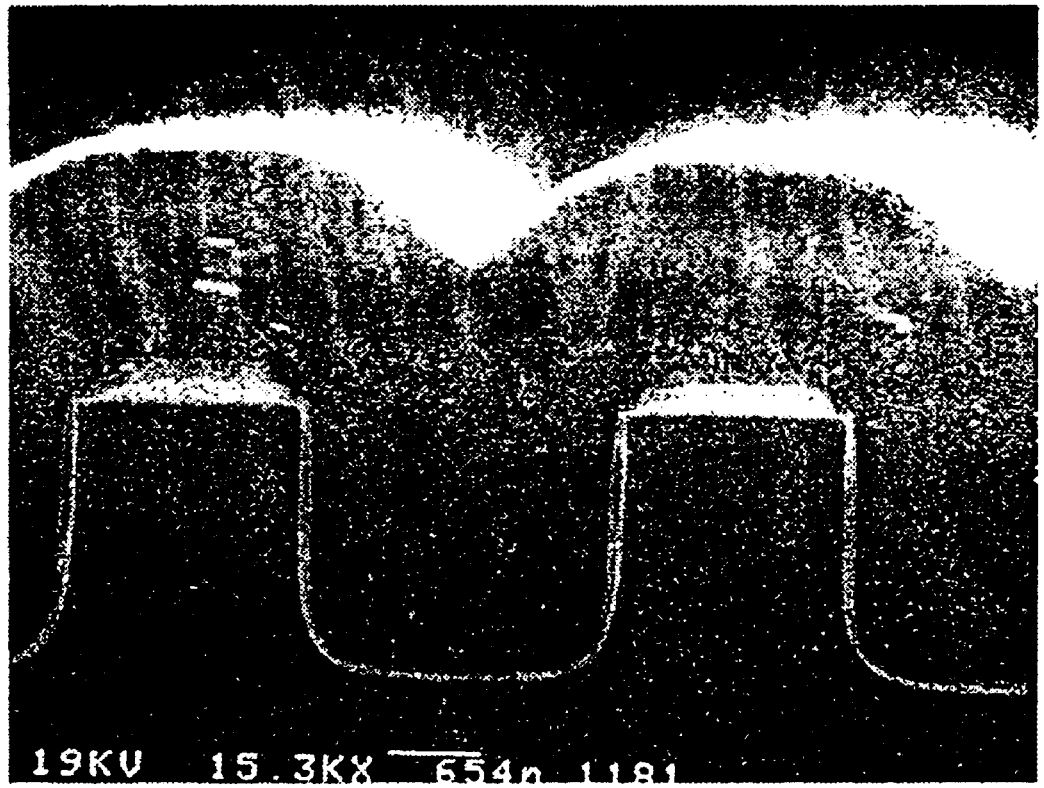
FIG. 4 is a cross-sectional scanning electron micrograph of a trench structure formed according to the invention.

FIG. 4 shows cross-sectional scanning electron micrograph of a trench device formed according to the invention.

The invention provides an improved method of forming trench structures as may be used in high power electronics. The process of the invention incorporates a sacrificial oxide to form a rounded trench structure. The rounded structure minimizes high electric field generation at the corners of the trench. The invention also teaches the use of a stacked gate or thickened insulator structure in the trench to minimize the formation of continuous pinholes. Such pinholes could lead to dielectric degradation or breakdown in the trench structures.

The invention may be employed with a typical trench power device. It will be appreciated that other devices such as capacitors, optical waveguides, trench field-effect transistors, gate-turn-off thyristors (GTOs), optical modulators, and the like may also benefit from the invention described herein.

It will also be appreciated that the certain described chemistries for etching the trenches, growing and depositing oxide, and polysilicon, for example, can be varied to achieve similar results while being kept within the spirit of the invention. Similarly, different sacrificial, PECVD, and gate oxide thicknesses may be applied to make trench devices with various degrees of roundedness. Thermal oxide has been described as an example mask for etching the trenches, however other hard masks may be used such as silicon nitride, and similar materials. Additionally, silicon dioxide may be used as an initial mask for the trench etch in combination with a photoresist mask. The use of an oxide mask as described can enhance making trench sidewall profiles more vertical, providing for improved packing and greater power density.

Many variations in processing steps may be employed, particularly following formation of the rounded trenches. It is envisioned that the rounding process disclosed herein may be included as a portion of a larger fabrication process. In addition, due to its inherent advantages for device reliability, the process of the invention will provide an enabling fabrication technique for manufacturing a wide variety of other power devices.

Obviously, many modifications and variations of the invention are possible in light of the above description. It is therefore to be understood that within the scope of the claims the invention may be practiced otherwise than as has been specifically described.

What is claimed is:

1. A method comprising:
   providing a substrate;
   forming a pattern on said substrate wherein portions of said substrate are exposed where trenches in said substrate are desired;
   forming trenches where said substrate is exposed by said pattern;
   removing said pattern;
   disposing a sacrificial thermal oxide layer upon said substrate and said trenches;
   removing said sacrificial oxide layer;
   providing a first gate oxide layer in said trench; and
   providing a second gate oxide layer over said first gate oxide layer.

2. The method of claim 1 wherein said pattern is formed by a photosensitive polymer.

3. The method of claim 1 wherein said pattern is formed by a photoresist.

4. The method of claim 1 wherein said trenches are formed by reactive ion etching.

5. The method of claim 1 wherein said trenches are formed by plasma processing.

6. The method of claim 1 wherein said pattern is removed by oxygen-plasma bombardment.

7. The method of claim 1 wherein said pattern is removed by ashing.

8. The method of claim 1 wherein said sacrificial oxide is disposed upon said substrate and said trenches by heating said substrate and trenches in an oxygen environment.

9. The method of claim 1 wherein said sacrificial oxide is removed by a wet etch process.

10. The method of claim 1 wherein said first gate oxide layer is provided by thermal oxidation processing.

11. The invention according to claim 10 wherein said first gate oxidation layer is provided at a temperature exceeding that of a temperature at which said second gate oxidation layer is provided.

12. The method of claim 1 wherein said second gate oxide is formed by a plasma enhanced chemical vapor deposition processing.

13. The method of claim 12 wherein said plasma enhanced chemical vapor deposition processing includes plasma enhanced tetra-ethyl ortho silicate processing.

14. A method comprising:
   providing a silicon substrate;
   forming a photoresist pattern on said substrate wherein portions of said substrate are exposed where trenches in said substrate are desired;
   plasma etching trenches where said substrate is exposed by said pattern;
   removing said pattern;
   disposing a sacrificial oxide layer upon said substrate and said trenches by heating said substrate and trenches in an oxygen environment;
   removing said sacrificial oxide layer by a buffered oxide etch;
   providing a first gate oxide layer in said trench by heating said trench in an oxygen environment; and
   providing a second gate oxide layer over said first gate oxide layer by plasma enhanced chemical vapor deposition processing.

15. The method of claim 14 wherein said pattern is removed by oxygen plasma bombardment.

16. The method of claim 14 wherein said pattern is removed by ashing.

17. The method of claim 14 wherein said plasma enhanced chemical vapor deposition processing includes plasma enhanced tetra-ethyl ortho silicate processing.

18. A method comprising:
   providing a silicon substrate;
   forming a photoresist pattern on said substrate wherein portions of said substrate are exposed where trenches in said substrate are desired;
   plasma etching trenches where said substrate is exposed by said pattern;
   removing said pattern by oxygen plasma bombardment;
   disposing a sacrificial oxide layer upon said substrate and said trenches by heating said substrate and trenches in an oxygen environment;
   removing said sacrificial oxide layer by a buffered oxide etch;
   providing a first gate oxide layer in said trench by heating said trench in an oxygen environment; and
   providing a second gate oxide layer over said first gate oxide layer by plasma enhanced tetra-ethyl ortho silicate processing.

19. The method of claim 18 wherein said plasma etching is provided at about 125 millitorr, a magnetic field of about 30 Gauss and an etch duration of about 250 seconds and includes CF4 at a flow rate of about 35 standard cubic centimeters per minute at a power of about 400 watts, HBr and CL2 at flow rates of about 80 standard cubic centimeters per minute and 10 standard cubic centimeters per minute, respectively, each at a power of about 300 watts.

20. The method of claim 18 wherein said sacrificial oxide layer is provided at about 600 torr at about 950 Celsius for about 65 minutes to a depth of about 250 nanometers by exposing said silicon substrate and said trenches to oxygen at about 3000 standard cubic centimeters per minute and Hydrogen at about 4000 standard cubic centimeters per minute.

21. The method of claim 18 wherein said buffered oxide etch includes a wet etch process of 10:1 Ammonium Flouride:Hydroflouric acid solution (40% NH4F: 49% HF).

22. The method of claim 18 wherein said first gate oxide is provided at about 875 Celsius for about 70.5 minutes to a depth of about 15 nanometers on said trench by exposing said trench to oxygen at about 3000 standard cubic centimeters per minute at about atmospheric pressure.

23. The method of claim 18 wherein said second gate oxide is provided at about 415 Celsius and about 725 Watts to a thickness of about 60 nanometers and includes providing Helium at a flow rate of about 1000 standard cubic centimeters per minute, oxygen at a flow rate of about 1200 standard cubic centimeters per minute, and tetra-ethyl ortho silicate at a flow rate of about 1000 standard cubic centimeters per minute.

\* \* \* \* \*